(12) United States Patent
Asaoka et al.

(10) Patent No.: US 12,426,437 B2
(45) Date of Patent: Sep. 23, 2025

(54) DISPLAY DEVICE

(71) Applicant: SHARP KABUSHIKI KAISHA, Sakai (JP)

(72) Inventors: Yasushi Asaoka, Sakai (JP); Tsuyoshi Kamada, Sakai (JP); Shigeru Aomori, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 493 days.

(21) Appl. No.: 17/793,775

(22) PCT Filed: Feb. 14, 2020

(86) PCT No.: PCT/JP2020/005879
§ 371 (c)(1),
(2) Date: Jul. 19, 2022

(87) PCT Pub. No.: WO2021/161527
PCT Pub. Date: Aug. 19, 2021

(65) Prior Publication Data
US 2023/0060279 A1 Mar. 2, 2023

(51) Int. Cl.
*H10K 50/13* (2023.01)
*H10K 50/115* (2023.01)
*H10K 50/15* (2023.01)
*H10K 59/35* (2023.01)

(52) U.S. Cl.
CPC .......... *H10K 50/13* (2023.02); *H10K 50/115* (2023.02); *H10K 50/15* (2023.02); *H10K 59/353* (2023.02)

(58) Field of Classification Search
CPC .......... H10K 50/115; H10K 50/00–88; H10K 50/11–135; H10K 50/82–828; H10K 59/00–95; H10K 2102/331; H10K 2101/30
See application file for complete search history.

(56) References Cited

U.S. PATENT DOCUMENTS

| | | | |
|---|---|---|---|
| 2010/0090241 A1* | 4/2010 | D'Andrade | H10K 50/125 257/40 |
| 2011/0180825 A1* | 7/2011 | Lee | H10K 50/852 257/89 |

(Continued)

FOREIGN PATENT DOCUMENTS

JP  2011155004 A  8/2011

*Primary Examiner* — Steven B Gauthier
*Assistant Examiner* — Adam D Weiland
(74) *Attorney, Agent, or Firm* — ScienBiziP, P.C.

(57) ABSTRACT

According to an aspect of the disclosure, a first light-emitting layer coincides in plan view with each whole of a plurality of pixel electrodes included in a plurality of second sub-pixels, and with each whole of a plurality of pixel electrodes included in a plurality of third sub-pixels. The first light-emitting layer is shaped into a continuous form. A third light-emitting layer in plan view: has an opening kb1 inside a peripheral end portion of each of a plurality of pixel electrodes included in a plurality of first sub-pixels, and coincides with a whole circumference of the peripheral end portion; and has an opening inside a peripheral end portion of each of a plurality of pixel electrodes included in the plurality of second sub-pixels, and coincides with a whole circumference of the peripheral end portion.

12 Claims, 10 Drawing Sheets

(56) References Cited

U.S. PATENT DOCUMENTS

| | | | |
|---|---|---|---|
| 2013/0069036 A1* | 3/2013 | Miyata | C09K 11/025 438/35 |
| 2013/0092913 A1* | 4/2013 | Nishimura | H10K 50/13 257/40 |
| 2016/0372525 A1* | 12/2016 | Yan | H10K 50/16 |
| 2017/0162816 A1* | 6/2017 | Kim | H10K 50/155 |

* cited by examiner

DISPLAY DEVICE

TECHNICAL FIELD

The disclosure relates to a display device.

BACKGROUND ART

Patent Document 1 discloses a configuration of a display device in which each of the sub-pixels is provided with a light-emitting element. In the display device, a light-emitting layer (an organic light-emitting layer) that emits a green light is shared with a red sub-pixel and a green sub-pixel.

CITATION LIST

Patent Literature

[Patent Document 1] Japanese Unexamined Patent Publication Application No. 2011-155004

SUMMARY

Technical Problem

A problem of the configuration disclosed in Patent Document 1 is that a light-emitting layer that emits a red light, a light-emitting layer that emits a green light, and a light-emitting layer that emits a green light have to be colored separately, inevitably making the production process complex.

Solution to Problem

A display device according to an aspect of the disclosure includes: a plurality of first sub-pixels each including a pixel electrode, a plurality of second sub-pixels each including a pixel electrode, and a plurality of third sub-pixels each including a pixel electrode. The display device includes: a first light-emitting layer that coincides in plan view with a plurality of the pixel electrodes included in the plurality of first sub-pixels; a second light-emitting layer that coincides in plan view with a plurality of the pixel electrodes included in the plurality of second sub-pixels; and a third light-emitting layer that coincides in plan view with a plurality of the pixel electrodes included in the plurality of third sub-pixels. The first light-emitting layer coincides in plan view with each whole of the plurality of pixel electrodes included in the plurality of second sub-pixels, and with each whole of the plurality of pixel electrodes included in the plurality of third sub-pixels, the first light-emitting layer being shaped into a continuous form. The third light-emitting layer in plan view: has an opening behind a peripheral end portion of each of the plurality of pixel electrodes included in the plurality of first sub-pixels, and coincides with a whole circumference of the peripheral end portion; and has an opening behind a peripheral end portion of each of the plurality of pixel electrodes included in the plurality of second sub-pixels, and coincides with a whole circumference of the peripheral end portion.

Advantageous Effects of Disclosure

According to an aspect of the disclosure, the first light-emitting layer coincides in plan view with each whole of the plurality of pixel electrodes included in the plurality of second sub-pixels, and with each whole of the plurality of pixel electrodes included in the plurality of third sub-pixels. The first light-emitting layer is shaped into a continuous form. Such features can simplify the production step of the display device.

BRIEF DESCRIPTION OF DRAWINGS

FIG. 3($b$) is a plan view of a configuration of each of the light-emitting layers according to the first embodiment.

FIG. 9($b$) is a plan view of a configuration of each of the light-emitting layers according to the second embodiment.

DESCRIPTION OF EMBODIMENTS

Figure 1:
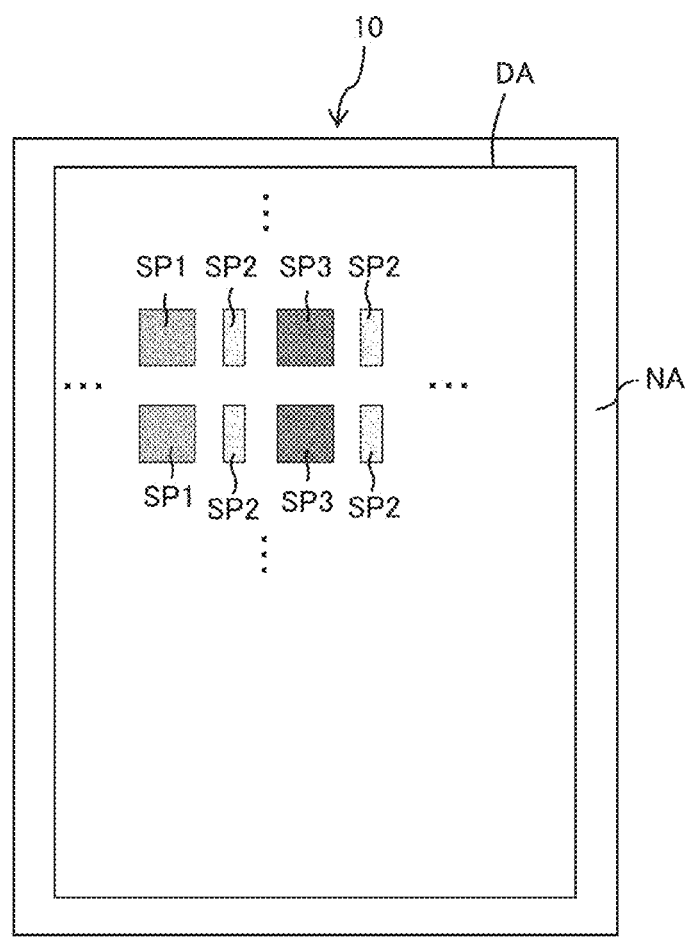
FIG. 1 is a plan view of a configuration of a display device according to this embodiment.

FIG. 1 is a plan view of a configuration of a display device according to this embodiment. As illustrated in FIG. 1, a display device 10 includes a display unit DA including: a plurality of first sub-pixels SP1 arranged in a column; a plurality of second sub-pixels SP2 arranged in a column; and a plurality of third sub-pixels SP3 arranged in a column. In a row, the first sub-pixels SP1, the second sub-pixels SP2, the third sub-pixels SP3, and the second sub-pixels SP2 are arranged in this order. A frame region NA surrounding the display region DA is provided with, for example, a terminal unit and various kinds of drivers.

First Embodiment

Figure 2:
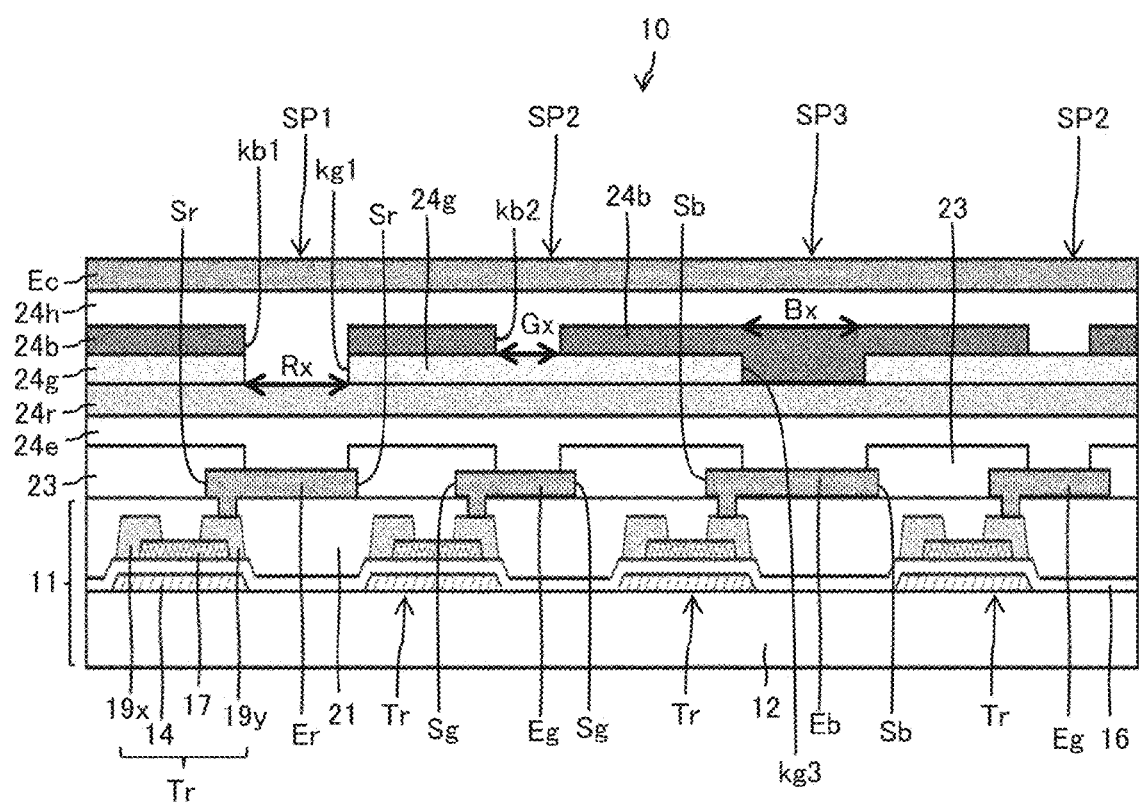
FIG. 2 is a cross-sectional view of a configuration of the display device according to a first embodiment.
Figure 3:
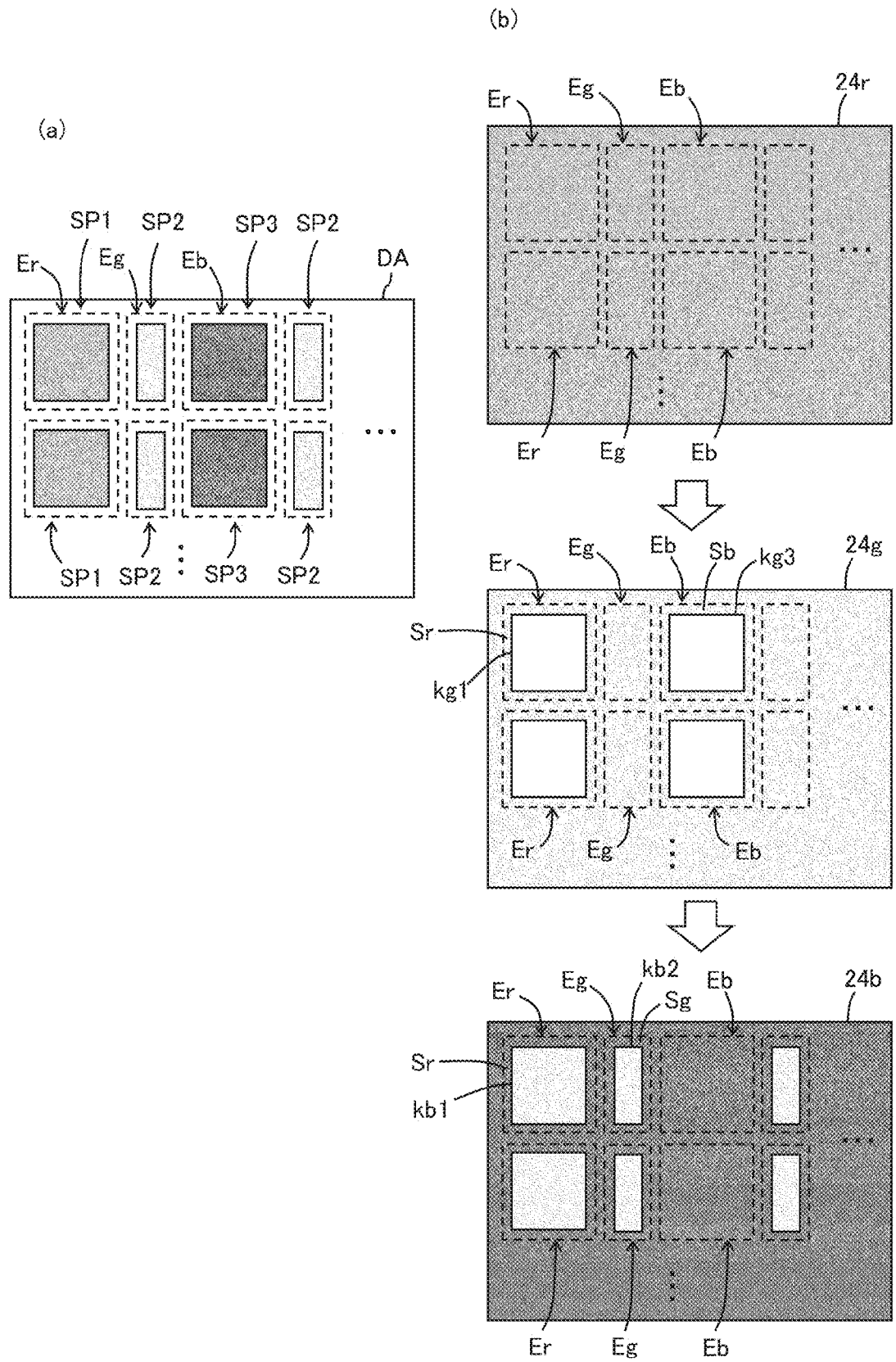
FIG. 3($a$) is a plan view of a configuration of a display unit according to the first embodiment.

FIG. 2 is a cross-sectional view of a configuration of the display device according to a first embodiment. FIG. 3($a$) is a plan view of a configuration of a display unit according to the first embodiment. FIG. 3($b$) is a plan view of a configuration of each of the light-emitting layers according to the first embodiment. The display device 10 includes: a thin-film transistor (TFT) layer 11; pixel electrodes (cathodes) Er, Eg, and Eb; an edge cover film 23; an electron-transport layer (an ETL) 24$e$; a first light-emitting layer 24$r$; a second light-emitting layer 24$g$; a third light-emitting layer 24$b$; a hole-transport layer (an HTL) 24$h$; and a common electrode (an anode) Ec, all of which are formed on a substrate 12 in this order.

The substrate 12 can be made of a glass substrate, or a flexible base material containing such a resin as polyimide as a principal component. An uppermost layer of the substrate 12 may be a barrier layer to block such foreign objects as water and oxygen.

As illustrated in FIG. 2, the TFT layer 11 includes: a gate electrode 14; a gate insulating film 16; a semiconductor layer 17; conductive electrodes 19x and 19y; and an interlayer insulating film 21. Each of the gate electrode 14 and the conductive electrodes 19x and 19y is made of a metal monolayer film containing at least one of such metals as, for example, aluminum, tungsten, molybdenum, tantalum, chromium, titanium, or copper. Alternatively, each electrode is made of a metal multilayer film containing the metals. The gate insulating film 16 can be, for example, a silicon oxide film or a silicon nitride film formed by the CVD. Alternatively, the gate insulating film 16 can be a multilayer film including these films.

The semiconductor layer 17 is formed of oxide semiconductor or polysilicon (LTPS). The gate electrode 14, the gate insulating film 16, and the semiconductor layer 17 constitute a transistor Tr. The interlayer insulating film 21; namely, a planarization film, can be made of, for example, an applicable organic material such as polyimide or acrylic resin.

On the interlayer insulating film 21, the pixel electrodes Er, Eg, and Eb are formed to connect to different transistors Tr. A pixel electrode Er is included in a first sub-pixel SP1. A pixel electrode Eg is included in a second sub-pixel SP2. A pixel electrode Eb is included in a third sub-pixel SP3. Each of the pixel electrodes Er, Eg, and Eb is shaped into an island. Peripheral end portions Sr, Sg, and Sb are covered with the cover film 23; whereas, non-peripheral-end portions are exposed (i.e. not covered with the edge cover film 23). The pixel electrodes Er, Eg, and Eb are light-reflective electrodes formed of, for example, indium tin oxide (ITO) and either silver (Ag) or an alloy containing Ag stacked on top of another.

In forming the edge cover film 23, such an organic material as, for example, polyimide or acrylic resin is applied. After that, the organic material is patterned by photolithography to form the edge cover film 23. The electron-transport layer 24e is formed to cover the non-peripheral-end portions of the pixel electrodes Er, Eg, and Eb, and the edge cover film 23.

As illustrated in FIGS. 2 and 3, on the electron-transport layer 24e, the first light-emitting layer 24r is formed to coincide in plan view with a plurality of the pixel electrodes Er included in the plurality of first sub-pixels SP1. On the first light-emitting layer 24r, the second light-emitting layer 24g is formed to coincide in plan view with a plurality of the pixel electrodes Eg included in the plurality of second sub-pixels SP2. On the second light-emitting layer 24g, the third light-emitting layer 24b is formed to coincide in plan view with a plurality of the pixel electrodes Eb included in the plurality of third sub-pixels SP3. The first light-emitting layer 24r is a quantum dot layer that emits a red light. The second light-emitting layer 24g is a quantum dot layer that emits a green light. The third light-emitting layer 24b is a quantum dot layer that emits a blue light.

The hole-transport layer 24h is formed to cover the first light-emitting layer 24r, the second light-emitting layer 24g, and the third light-emitting layer 24b. The common electrode Ec covering the hole-transport layer 24h is made of, for example, such a metal thin film as a magnesium-silver alloy. The common electrode Ec is transparent to light.

In the first light-emitting layer 24r, holes and electrons recombine together by a drive current between the pixel electrodes Er and the common electrode Ec, which forms an exciton. While the exciton transforms from a conduction band level to a valence band level of quantum dots, the red light is released. In the second light-emitting layer 24g, holes and electrons recombine together by a drive current between the pixel electrodes Eg and the common electrode Ec, which forms an exciton. While the exciton transforms from a conduction band level to a valence band level of quantum dots, the green light is released. In the third light-emitting layer 24b, holes and electrons recombine together by a drive current between the pixel electrodes Eb and the common electrode Ec, which forms an exciton. While the exciton transforms from a conduction band level to a valence band level of quantum dots, the blue light is released.

Figure 4:
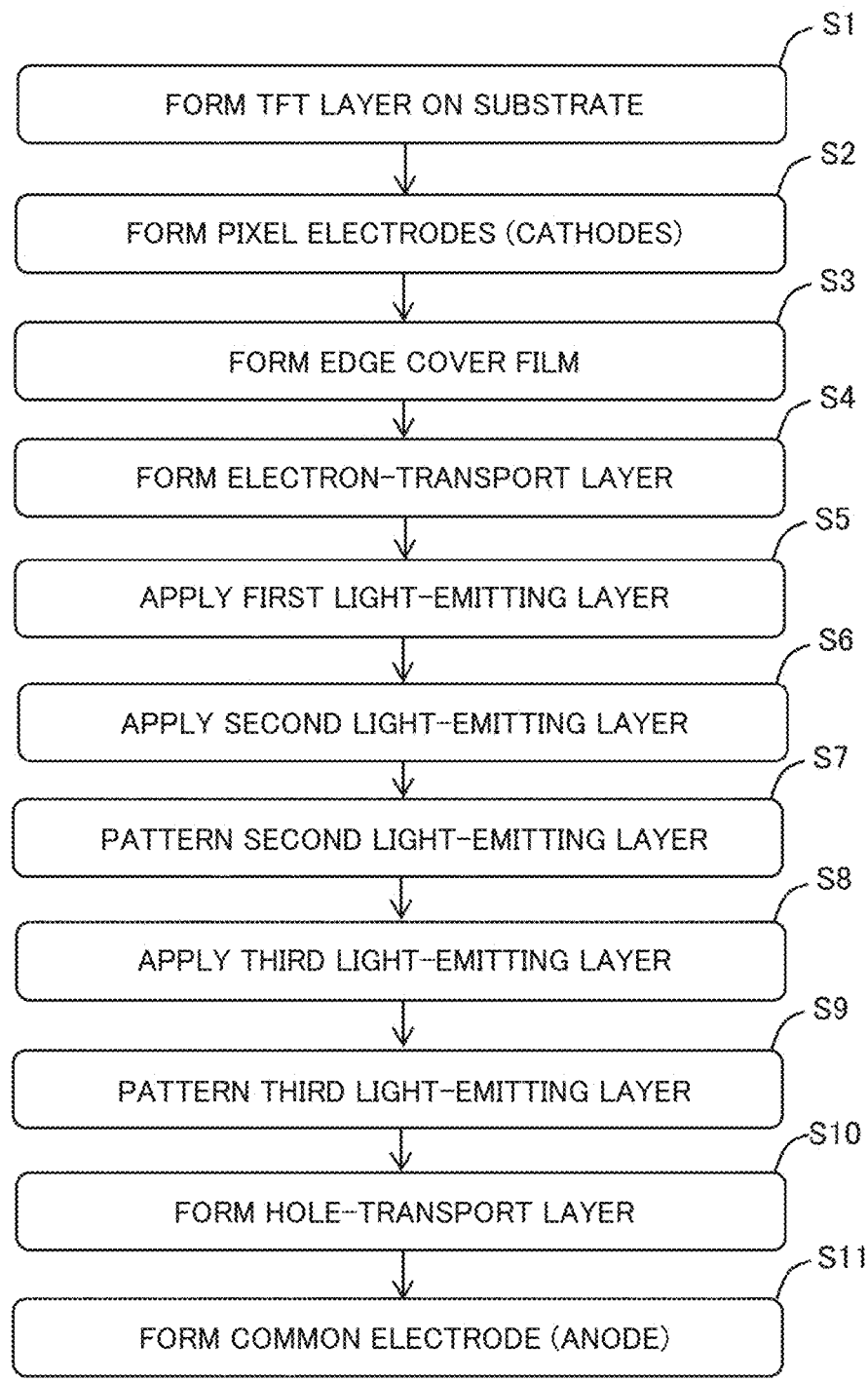
FIG. 4 is a flowchart showing a method for producing the display device according to the first embodiment.

FIG. 4 is a flowchart showing a method for producing the display device according to the first embodiment. At Step S1, the TFT layer 11 is formed on the substrate 12. At Step S2, the pixel electrodes (the cathodes) Er, Eg, and Eb are formed. At Step S3, the edge cover film 23 is formed. At Step S4, the electron-transport layer 24e is formed. At Step S5, the first light-emitting layer 24r is applied. At Step S6, the second light-emitting layer 24g is applied. At Step S7, the second light-emitting layer 24g is patterned by, for example, photolithography. At Step S8, the third light-emitting layer 24b is applied. At Step S9, the third light-emitting layer 24b is patterned by, for example, photolithography. At Step S10, the hole-transport layer 24h is formed. At Step S11, the common electrode (the anode) Ec is formed.

In the first embodiment, as illustrated in FIGS. 2 and 3, each of the plurality of first sub-pixels SP1, the plurality of second sub-pixels SP2, and the plurality of third sub-pixels SP3 includes the common hole-transport layer 24.

The first light-emitting layer 24r coincides in plan view with each whole of the plurality of pixel electrodes Eg included in the plurality of second sub-pixels SP2, and with each whole of the plurality of pixel electrodes Eb included in the plurality of third sub-pixels SP3. The first light-emitting layer 24r is shaped into a continuous form.

The second light-emitting layer 24g in plan view: has an opening kg1 behind the peripheral end portion Sr of each of the plurality of pixel electrodes Er included in the plurality of first sub-pixels SP1, and coincides with a whole circumference of the peripheral end portion Sr; and has an opening kg3 behind the peripheral end portion Sb of each of the plurality of pixel electrodes Eb included in the plurality of third sub-pixels SP3, and coincides with a whole circumference of the peripheral end portion Sb.

The third light-emitting layer 24b in plan view: has an opening kb1 behind the peripheral end portion Sr of each of the plurality of pixel electrodes Er included in the plurality of first sub-pixels SP1, and coincides with the whole circumference of the peripheral end portion Sr; and has an opening kb2 behind the peripheral end portion Sg of each of the plurality of pixel electrodes Eg included in the plurality of second sub-pixels SP2, and coincides with a whole circumference of the peripheral end portion Sg.

In FIGS. 2 and 3, the opening kb1 and the opening kg1 match. The hole-transport layer 24h is in contact with each of the first light-emitting layer 24r, the second light-emitting layer 24g, and the third light-emitting layer 24b. That is, in the second sub-pixel SP2, the second light-emitting layer 24g is disposed between the first light-emitting layer 24r and the hole-transport layer 24h. In the third sub-pixel SP3, the third light-emitting layer 24b is disposed between the first light-emitting layer 24r and the hole-transport layer 24h.

Hence, the first light-emitting layer 24r emits the red light near an interface with the hole-transport layer 24h, the second light-emitting layer 24g emits the green light near an interface with the hole-transport layer 24h, and the third light-emitting layer 24b emits the blue light near an interface with the hole-transport layer 24h. The second sub-pixel SP2 has a light-emitting region Gx that coincides in plan view with the first light-emitting layer 24r and the second light-emitting layer 24g. The third sub-pixel SP3 has a light-emitting region Bx that coincides in plan view with the first light-emitting layer 24r and the third light-emitting layer 24b.

According to the first embodiment, the first light-emitting layer 24r is shaped into a continuous form (i.e. a monolithic form) that coincides in plan view with each whole of the plurality of pixel electrodes Er included in the plurality of first sub-pixels SP1, with each whole of the plurality of pixel electrodes Eg included in the plurality of second sub-pixels SP2, and with each whole of the plurality of pixel electrodes Eb included in the plurality of third sub-pixels SP3. Hence, the first light-emitting layer 24r does not have to be patterned. This feature simplifies a step of producing the display device 10.

Figure 5:
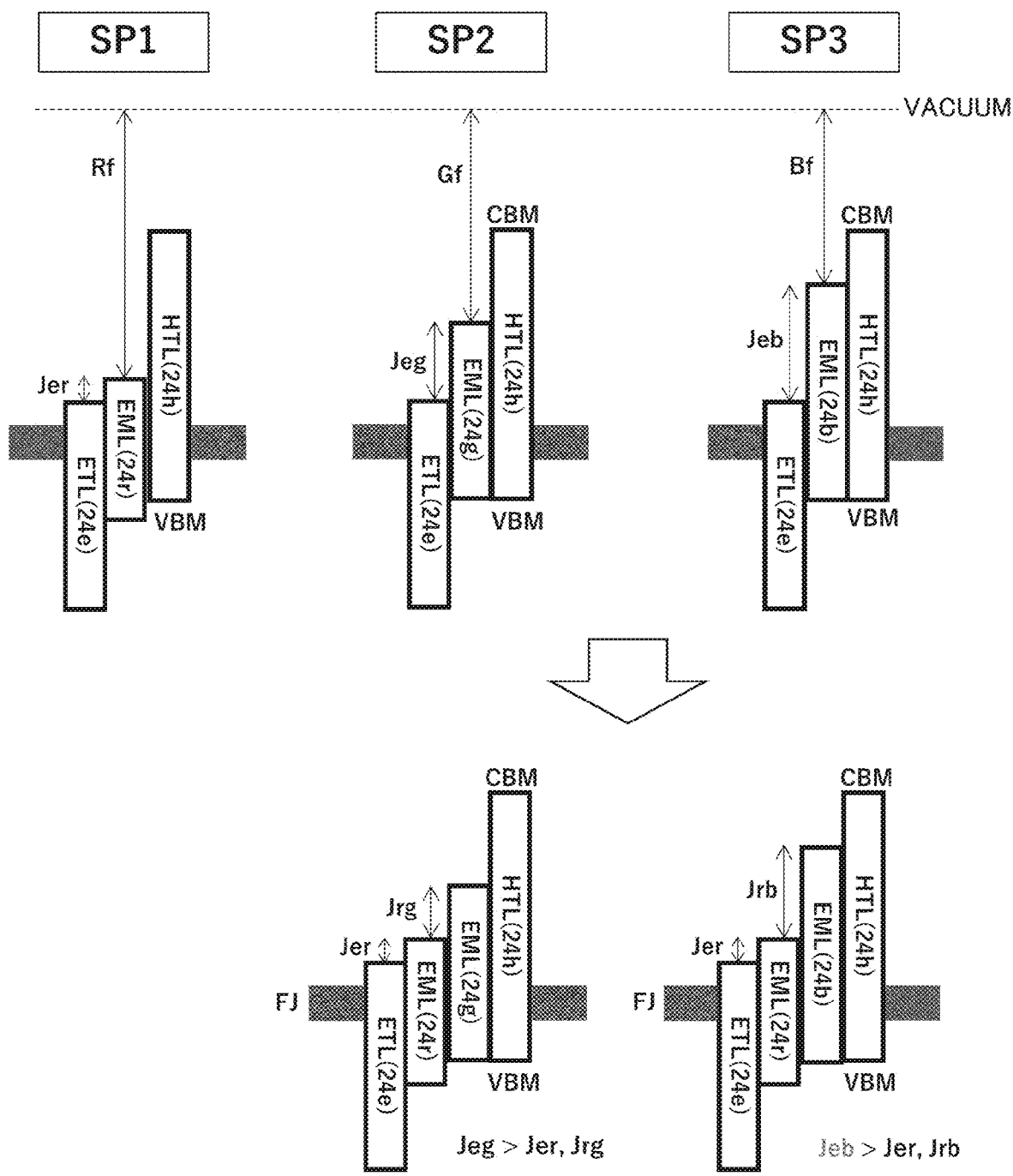
FIG. 5 illustrates bandgap diagrams showing effects of the first embodiment.

FIG. 5 illustrates bandgap diagrams showing effects of the first embodiment. In the first embodiment, the following relationship holds: an electron affinity Rf of the first light-emitting layer 24r>an electron affinity Gf of the second light-emitting layer 24g>an electron affinity Bf of the third light-emitting layer 24b.

Hence, in the second sub-pixel SP2, the first light-emitting layer 24r coincides with the second light-emitting layer 24g toward the cathodes. This configuration reduces an electron injection barrier Jer from the electron-transport layer 24e to the first light-emitting layer 24r and an electron injection barrier Jrg from the first light-emitting layer 24r to the second light-emitting layer 24g when the electrons are transported from a conduction band minimum level (CBM) of the electron-transport layer 24e through a conduction band minimum level of the first light-emitting layer 24r to a conduction band minimum level of the second light-emitting layer 24g, compared with an electron injection barrier Jeg between the electron-transport layer 24e and the second light-emitting layer 24g when the electrons are transported from a Fermi level FJ of the pixel electrode (the cathode) Eg through the conduction band minimum level of the electron-transport layer 24e to the conduction band minimum level of the second light-emitting layer 24g. This feature facilitates transportation of charges from the electron-transport layer 24e to the first light-emitting layer 24r and from the first light-emitting layer 24r to the second light-emitting layer 24g, and reduces accumulation of the charges on each of the interfaces. That is, the feature enhances efficiency in injection of the electrons into the second light-emitting layer 24g.

Likewise, in the third sub-pixel SP3, the first light-emitting layer 24r coincides with the third light-emitting layer 24b toward the cathode. This configuration reduces an electron injection barrier Jer from the electron-transport layer 24e to the first light-emitting layer 24r and an electron injection barrier Jrb from the first light-emitting layer 24r to the third light-emitting layer 24b when the electrons are transported from the conduction band minimum level of the electron-transport layer 24e through the conduction band minimum level of the first light-emitting layer 24r to a conduction band minimum level of the third light-emitting layer 24b, compared with an electron injection barrier Jeb between the electron-transport layer 24e and the third light-emitting layer 24b when the electrons are transported from a Fermi level of the pixel electrode (the cathode) Eb through the conduction band minimum level of the electron-transport layer 24e to the conduction band minimum level of the third light-emitting layer 24b. This feature facilitates transportation of charges from the electron-transport layer 24e to the first light-emitting layer 24r and from the first light-emitting layer 24r to the third light-emitting layer 24b, and reduces accumulation of the charges on each of the interfaces. That is, the feature enhances efficiency in injection of the electrons into the third light-emitting layer 24b.

Figure 6:
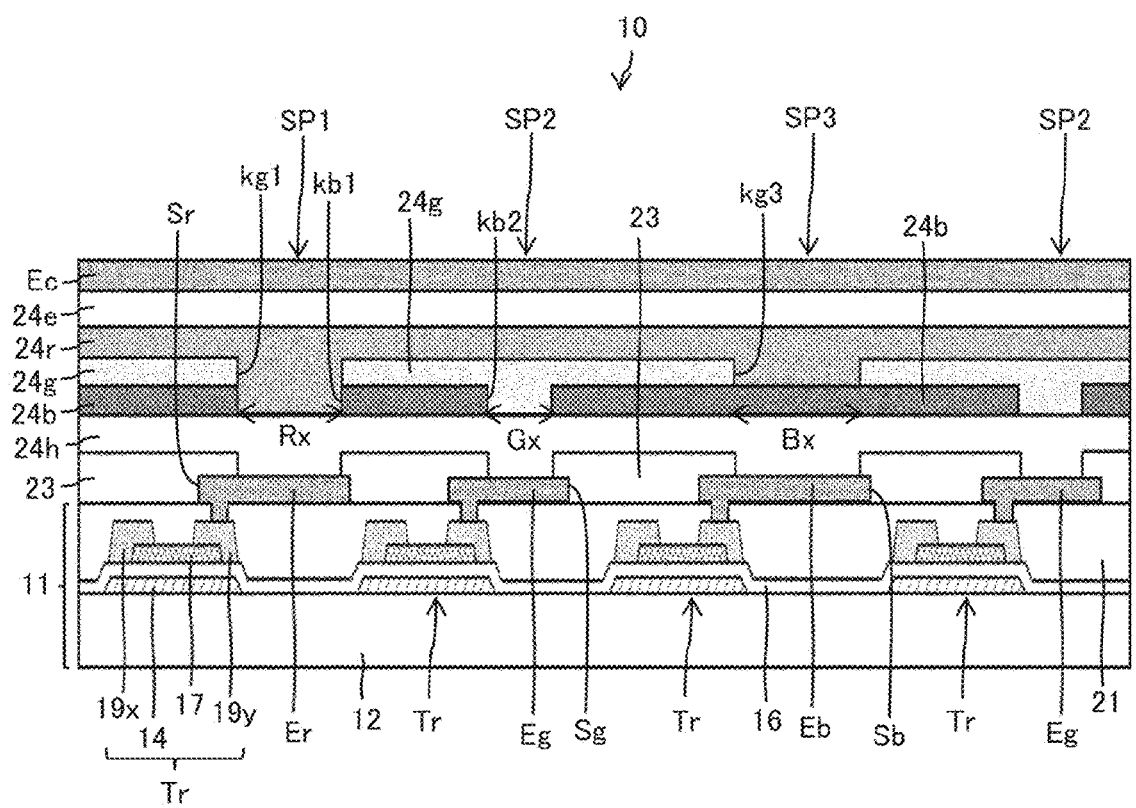
FIG. 6 is a cross-sectional view illustrating a modification of the display device according to the first embodiment.

FIG. 6 is a cross-sectional view illustrating a modification of the display device according to the first embodiment. The display device 10 in FIG. 6 includes: the thin-film transistor (TFT) layer 11; the pixel electrodes (anodes) Er, Eg, and Eb; the edge cover film 23; the hole-transport layer (the HTL) 24h; the third light-emitting layer 24b; the second light-emitting layer 24g; the first light-emitting layer 24r; the electron-transport layer (the ETL) 24e; and the common electrode (the cathode) Ec, all of which are formed on the substrate 12 in this order.

In the second sub-pixel SP2, the second light-emitting layer 24g is disposed between the first light-emitting layer 24r and the hole-transport layer 24h. In the third sub-pixel SP3, the third light-emitting layer 24b is disposed between the first light-emitting layer 24r and the hole-transport layer 24h.

In FIG. 6, the electron-transport layer 24e is provided in common among the plurality of first sub-pixels SP1, the plurality of second sub-pixels SP2, and the plurality of third sub-pixels SP3. In a second sub-pixel SP2, the first light-emitting layer 24r is disposed between the second light-emitting layer 24g and the electron-transport layer 24e. In a third sub-pixel SP3, the first light-emitting layer 24r is disposed between the third light-emitting layer 24b and the electron-transport layer 24e. In the second sub-pixel SP2, the first light-emitting layer 24r is disposed between the second light-emitting layer 24g and the common electrode Ec. In the third sub-pixel SP3, the first light-emitting layer 24r is disposed between the third light-emitting layer 24b and the common electrode Ec. Moreover, in each of the plurality of first sub-pixels SP1, the plurality of second sub-pixels SP2, and the plurality of third sub-pixels SP3, the electron-transport layer 24e is disposed between the common electrode Ec and the first light-emitting layer 24r.

Figure 7:
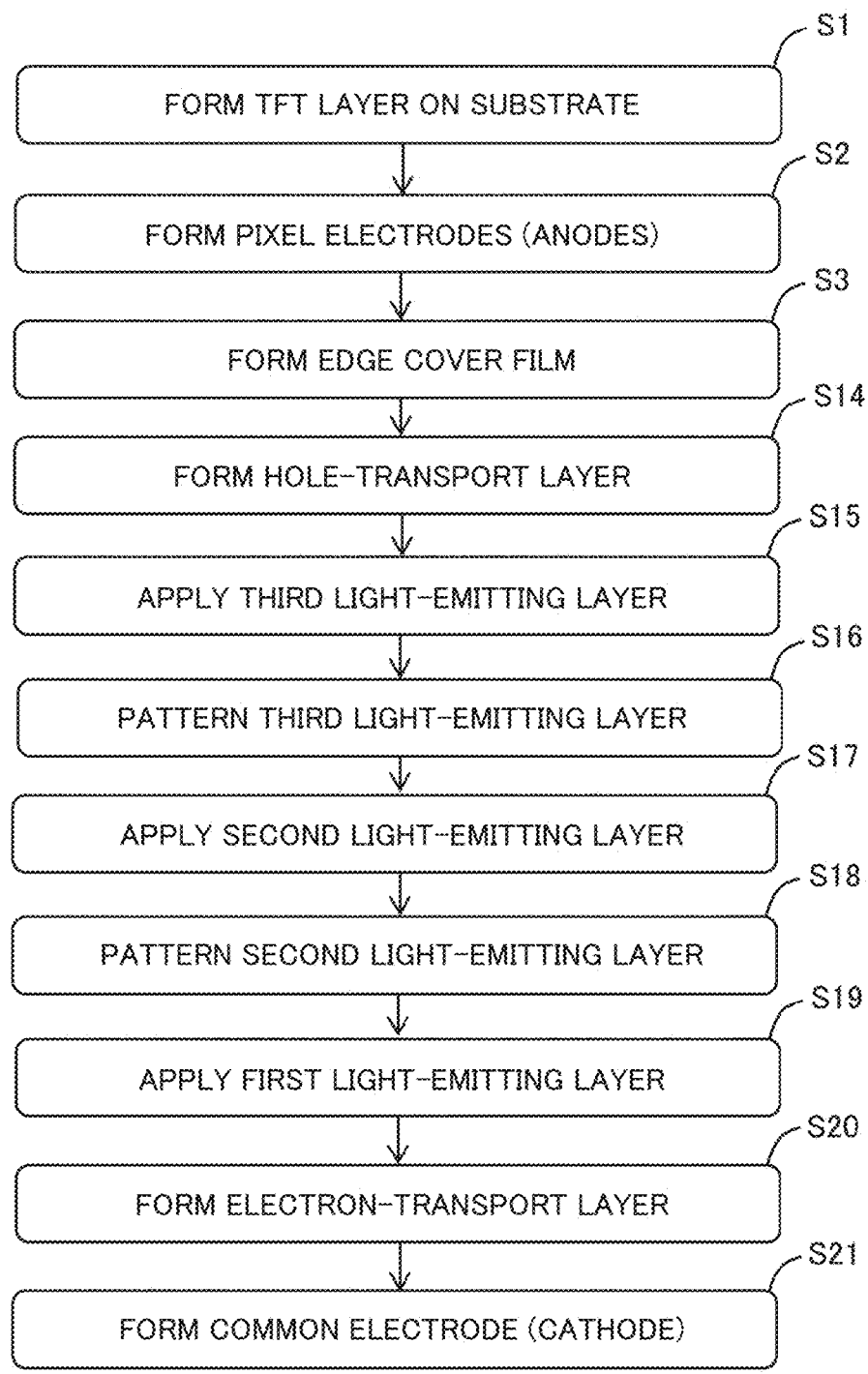
FIG. 7 is a flowchart showing a method for producing the display device in FIG. 6.

FIG. 7 is a flowchart showing a method for producing the display device in FIG. 6. At Step S1, the TFT layer 11 is formed on the substrate 12. At Step S2, the pixel electrodes (the anodes) Er, Eg, and Eb are formed. At Step S3, the edge cover film 23 is formed. At Step S14, the hole-transport layer 24h is formed. At Step S15, the third light-emitting layer 24b is applied. At Step S16, the third light-emitting layer 24b is patterned by, for example, photolithography. At Step S17, the second light-emitting layer 24g is applied. At Step S18, the second light-emitting layer 24g is patterned by, for example, photolithography. At Step S19, the first light-emitting layer 24r is applied. At Step S20, the electron-transport layer 24e is formed. At Step S21, the common electrode (the cathode) Ec is formed.

Figure 8:
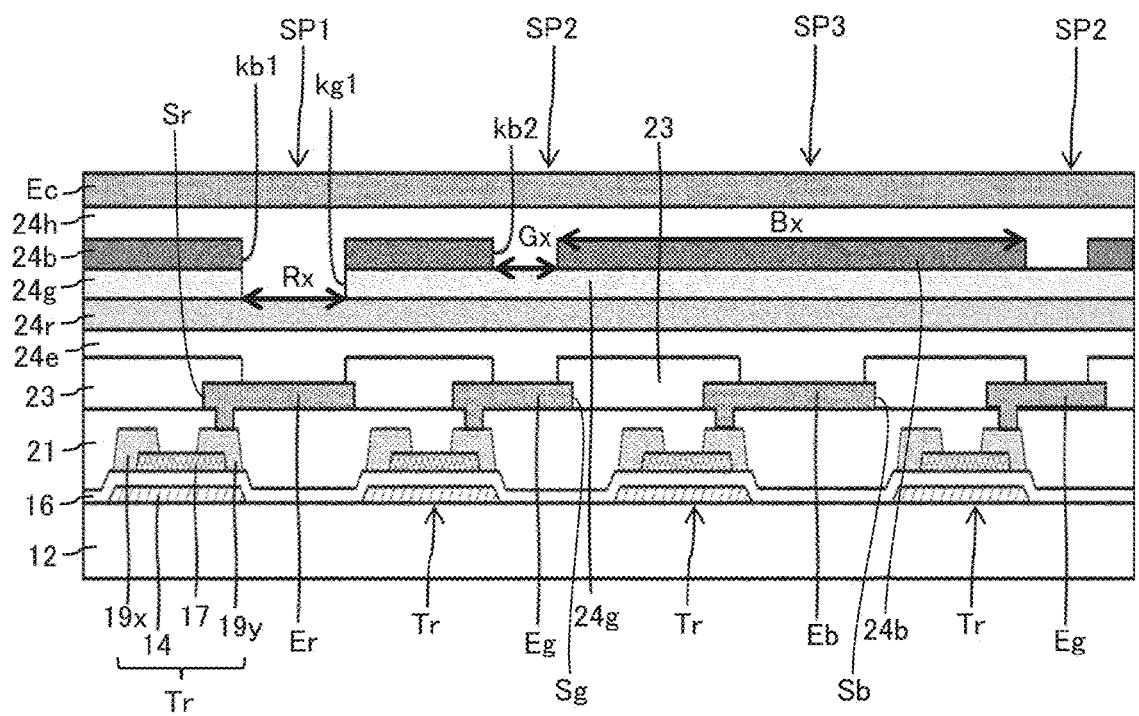
FIG. 8 is a cross-sectional view of a configuration of the display device according to a second embodiment.

FIG. 8 is a cross-sectional view illustrating a configuration of the display device according to a second embodiment. FIG. 9(a) is a plan view of a configuration of a display unit according to the second embodiment. FIG. 9(b) is a plan view of a configuration of each of the light-emitting layers according to the second embodiment.

Figure 9:
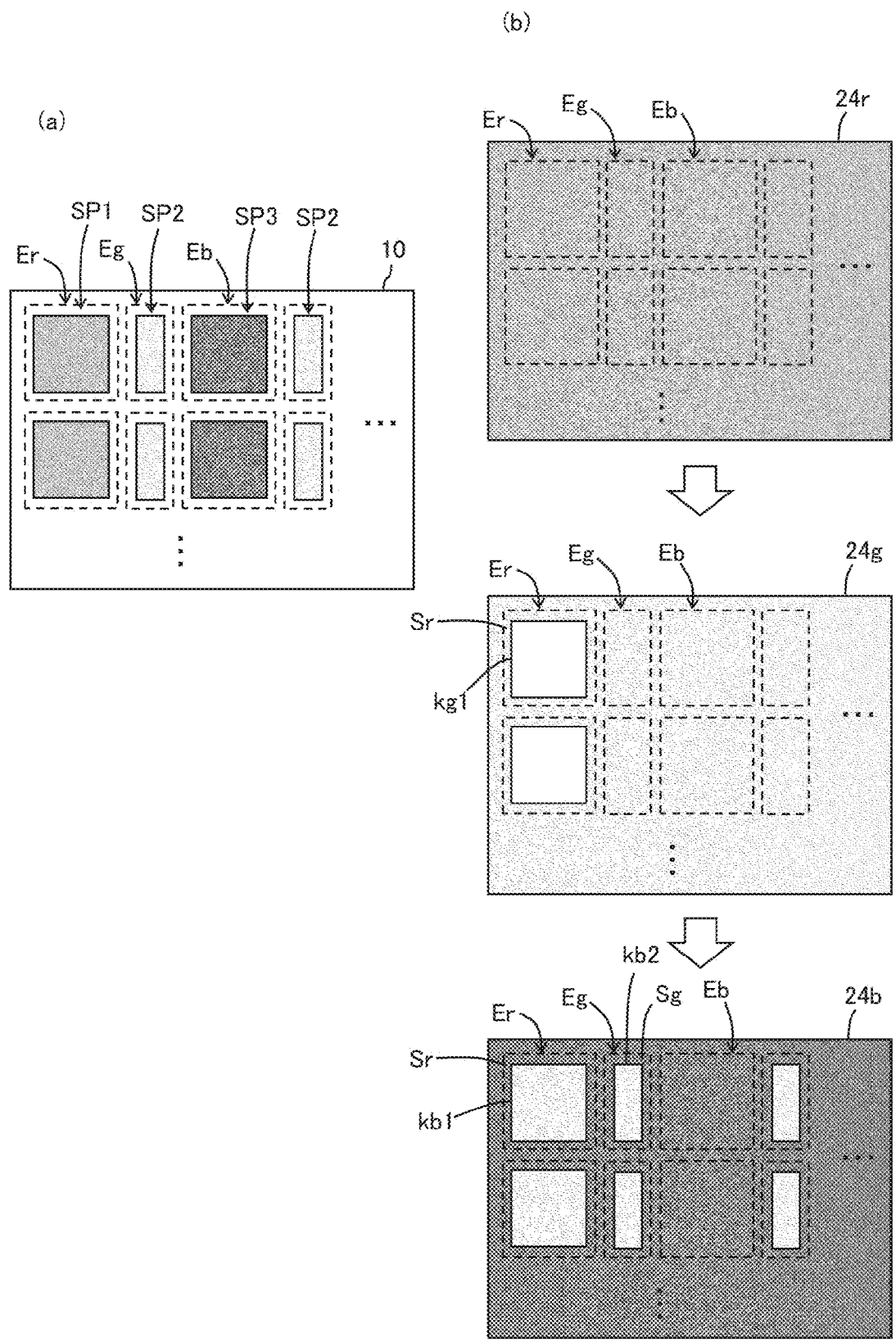
FIG. 9($a$) is a plan view of a configuration of a display unit according to the second embodiment.

In the second embodiment, as illustrated in FIGS. 8 and 9, each of the plurality of first sub-pixels SP1, the plurality of second sub-pixels SP2, and the plurality of third sub-pixels SP3 includes in common the hole-transport layer 24h.

The first light-emitting layer 24r coincides in plan view with each whole of the plurality of pixel electrodes Eg included in the plurality of second sub-pixels SP2, and with each whole of the plurality of pixel electrodes Eb included in the plurality of third sub-pixels SP3. The first light-emitting layer 24r is shaped into a continuous form.

The second light-emitting layer 24g in plan view has the opening kg1 behind the peripheral end portion Sr of each of the plurality of pixel electrodes Er included in the plurality of first sub-pixels SP1, and coincides with a whole circumference of the peripheral end portion Sr.

The third light-emitting layer 24b in plan view: has the opening kb1 behind the peripheral end portion Sr of each of the plurality of pixel electrodes Er included in the plurality of first sub-pixels SP1, and coincides with the whole circumference of the peripheral end portion Sr; and has the opening kb2 behind the peripheral end portion Sg of each of the plurality of pixel electrodes Eg included in the plurality of second sub-pixels SP2, and coincides with the whole circumference of the peripheral end portion Sg.

In FIGS. 8 and 9, the opening kb1 and the opening kg1 match. The hole-transport layer 24h is in contact with each of the first light-emitting layer 24r, the second light-emitting layer 24g, and the third light-emitting layer 24b. That is, in the second sub-pixel SP2, the second light-emitting layer 24g is disposed between the first light-emitting layer 24r and the hole-transport layer 24h. In the third sub-pixel SP3, the second light-emitting layer 24g in contact with the first light-emitting layer 24r and the third light-emitting layer 24b in contact with the hole-transport layer 24h are disposed between the first light-emitting layer 24r and the hole-transport layer 24h.

Hence, the first light-emitting layer 24r emits a red light near an interface with the hole-transport layer 24h, the second light-emitting layer 24g emits a green light near an interface with the hole-transport layer 24h, and the third light-emitting layer 24b emits a blue light near an interface with the hole-transport layer 24h. The second sub-pixel SP2 has the light-emitting region Gx that coincides in plan view with the first light-emitting layer 24r and the second light-emitting layer 24g. The third sub-pixel SP3 has the light-emitting region Bx that coincides in plan view with the first light-emitting layer 24r, the second light-emitting layer 24g, and the third light-emitting layer 24b.

According to the second embodiment, the first light-emitting layer 24r is shaped into a continuous form (i.e. a monolithic form) that coincides in plan view with each whole of the plurality of pixel electrodes Er included in the plurality of first sub-pixels SP1, with each whole of the plurality of pixel electrodes Eg included in the plurality of second sub-pixels SP2, and with each whole of the plurality of pixel electrodes Eb included in the plurality of third sub-pixels SP3. Hence, the first light-emitting layer 24r does not have to be patterned. Such a feature simplifies a step of producing the display device 10.

Moreover, in the second embodiment, the following relationship holds: the electron affinity Rf of the first light-emitting layer 24r>the electron affinity Gf of the second light-emitting layer 24g>the electron affinity Bf of the third light-emitting layer 24b. Hence, in the third sub-pixel SP3, the second light-emitting layer 24g and the first light-emitting layer 24r coincide with the third light-emitting layer 24b toward the cathode. This configuration reduces an electron injection barrier between each of the layers from a Fermi level of the pixel electrode (the cathode) to a conduction band minimum level (CMB) of the third light-emitting layer 24b. Such a feature can enhance efficiency in injection of the electrons into the third light-emitting layer 24b.

Figure 10:
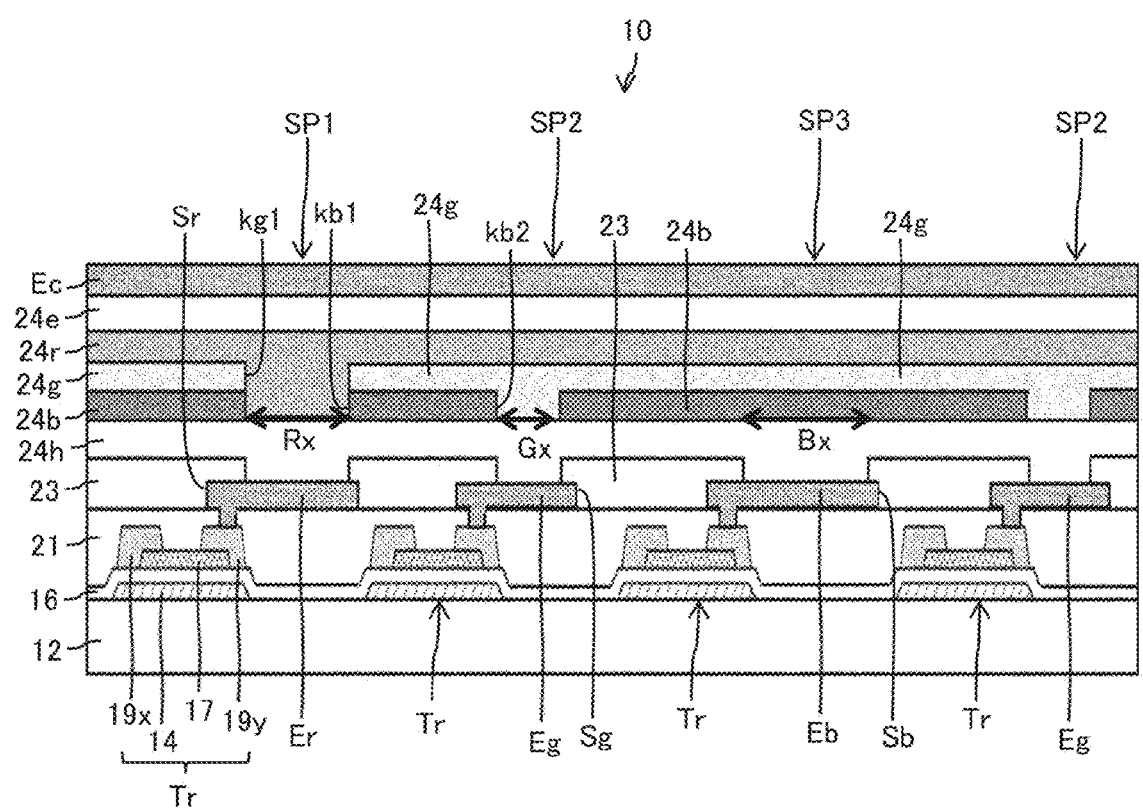
FIG. 10 is a cross-sectional view illustrating a modification of the display device according to the second embodiment.

FIG. 10 is a cross-sectional view illustrating a modification of the display device according to the second embodiment. The display device 10 in FIG. 10 includes: the thin-film transistor (TFT) layer 11; the pixel electrodes (anodes) Er, Eg, and Eb; the edge cover film 23; the hole-transport layer (the HTL) 24h; the third light-emitting layer 24b; the second light-emitting layer 24g; the first light-emitting layer 24r; the electron-transport layer (the ETL) 24e; and the common electrode (the cathode) Ec, all of which are formed on the substrate 12 in this order.

In the second sub-pixel SP2, the second light-emitting layer 24g is disposed between the first light-emitting layer 24r and the hole-transport layer 24h. In the third sub-pixel SP3, the second light-emitting layer 24g in contact with the first light-emitting layer 24r and the third light-emitting layer 24b in contact with the hole-transport layer 24h are disposed between the first light-emitting layer 24r and the hole-transport layer 24h.

In FIG. 10, the electron-transport layer 24e is provided in common among the plurality of first sub-pixels SP1, the plurality of second sub-pixels SP2, and the plurality of third sub-pixels SP3. In a second sub-pixel SP2, the first light-emitting layer 24r is disposed between the second light-emitting layer 24g and the electron-transport layer 24e. In a third sub-pixel SP3, the first light-emitting layer 24r is disposed between the third light-emitting layer 24b and the electron-transport layer 24e. In the second sub-pixel SP2, the first light-emitting layer 24r is disposed between the second light-emitting layer 24g and the common electrode Ec. In the third sub-pixel SP3, the first light-emitting layer 24r is disposed between the third light-emitting layer 24b and the common electrode Ec. Moreover, in each of the plurality of first sub-pixels SP1, the plurality of second sub-pixels SP2, and the plurality of third sub-pixels SP3, the electron-transport layer 24e is disposed between the common electrode Ec and the first light-emitting layer 24r.

Each of the above embodiments is intended to provide examples and descriptions, not to provide limitations. It is apparent for those skilled in the art that many modifications are applicable in accordance with these examples and descriptions.

The invention claimed is:

1. A display device comprising a plurality of first sub-pixels, each including a pixel electrode; a plurality of second sub-pixels, each including a pixel electrode; and a plurality of third sub-pixels, each including a pixel electrode, the display device comprising:
   a first light-emitting layer that overlaps, in a plan view, with the pixel electrode included in each of the plurality of first sub-pixels;
   a second light-emitting layer that overlaps, in the plan view, with the pixel electrode included in each of the plurality of second sub-pixels; and
   a third light-emitting layer that overlaps, in the plan view, with the pixel electrode included in each of the plurality of third sub-pixels,
   wherein the first light-emitting layer overlaps, in the plan view, with an entirety of the pixel electrode included in each of the plurality of second sub-pixels, and with an entirety of the pixel electrode included in each of the plurality of third sub-pixels, the first light-emitting layer being shaped into a continuous form,
   the third light-emitting layer, in the plan view, has a first opening inside a first peripheral end portion of the pixel electrode included in each of the plurality of first sub-pixels, and overlaps with an entire circumference of the first peripheral end portion, and the third light-emitting layer, in the plan view, has a second opening inside a second peripheral end portion of the pixel electrode included in each of the plurality of second sub-pixels, and overlaps with an entire circumference of the second peripheral end portion.

2. The display device according to claim 1,
wherein the second light-emitting layer in the plan view, has a third opening inside the first peripheral end portion of the pixel electrode included in each of the plurality of first sub-pixels, and overlaps with the entire circumference of the first peripheral end portion, and
the second light-emitting layer, in the plan view, has a fourth opening inside a third peripheral end portion of the pixel electrode included in each of the plurality of third sub-pixels, and overlaps with an entire circumference of the third peripheral end portion.

3. The display device according to claim 2,
wherein each of the plurality of third sub-pixels has a light-emitting region that overlaps, in the plan view, with the first light-emitting layer and the third light-emitting layer, and
each of the plurality of second sub-pixels has a light-emitting region that overlaps, in the plan view, with the first light-emitting layer and the second light-emitting layer.

4. The display device according to claim 1,
wherein the second light-emitting layer, in the plan view, has a third opening inside the first peripheral end portion of the pixel electrode included in each of the plurality of first sub-pixels, and overlaps with the entire circumference of the first peripheral end portion.

5. The display device according to claim 4,
wherein each of the third sub-pixels has a light-emitting region that coincides in plan view with the first light-emitting layer, the second light-emitting layer, and the third light-emitting layer, and
each of the second sub-pixels has a light-emitting region that coincides in plan view with the first light-emitting layer and the second light-emitting layer.

6. The display device according to claim 1,
wherein an electron affinity of the first light-emitting layer is larger than an electron affinity of the second light-emitting layer, and
the electron affinity of the second light-emitting layer is larger than an electron affinity of the third light-emitting layer.

7. The display device according to claim 1,
wherein each of the plurality of first sub-pixels, the plurality of second sub-pixels, and the plurality of third sub-pixels includes a hole-transport layer,
in each of the plurality of second sub-pixels, the second light-emitting layer is disposed between the first light-emitting layer and the hole-transport layer, and
in each of the plurality of third sub-pixels, the third light-emitting layer is disposed between the first light-emitting layer and the hole-transport layer.

8. The display device according to claim 1, further comprising:
a common electrode provided in common among the plurality of first sub-pixels, the plurality of second sub-pixels, and the plurality of third sub-pixels,
wherein in each of the plurality of second sub-pixels, the first light-emitting layer is disposed between the second light-emitting layer and the common electrode, and
in each of the plurality of third sub-pixels, the first light-emitting layer is disposed between the third light-emitting layer and the common electrode.

9. The display device according to claim 8,
wherein each of the plurality of first sub-pixels, the plurality of second sub-pixels, and the plurality of third sub-pixels further includes an electron-transport layer, and
in each of the plurality of first sub-pixels, the plurality of second sub-pixels, and the plurality of third sub-pixels, the electron-transport layer is disposed between the common electrode and the first light-emitting layer.

10. The display device according to claim 1,
wherein the first light-emitting layer includes quantum dots that emit a red light, the second light-emitting layer includes quantum dots that emit a green light, and the third light-emitting layer includes quantum dots that emit a blue light.

11. The display device according to claim 1,
wherein each of the second light-emitting layer and the third light-emitting layer is shaped into a continuous form.

12. The display device according to claim 1,
wherein the pixel electrode in each of the plurality of first sub-pixels, the pixel electrode in each of the plurality of second sub-pixels, and the pixel electrode in each of the plurality of third sub-pixels are each shaped into an island, have a peripheral end portion covered with an edge cover film, and have a non-peripheral-end portion not covered with the edge cover film.

* * * * *